US007075386B2

(12) United States Patent
Kearns

(10) Patent No.: US 7,075,386 B2

(45) Date of Patent: Jul. 11, 2006

(54) ANTENNA SWITCHING CIRCUIT

(75) Inventor: Brian Kearns, Dublin 22 (IE)

(73) Assignee: TDK Corporation, Tokyo (JP)

( * ) Notice: Subject to any disclaimer, the term of this patent is extended or adjusted under 35 U.S.C. 154(b) by 13 days.

(21) Appl. No.: 10/916,140

(22) Filed: Aug. 11, 2004

(65) Prior Publication Data

US 2005/0035824 A1 Feb. 17, 2005

(30) Foreign Application Priority Data

Aug. 15, 2003 (EP) .................................. 03394075

(51) Int. Cl.
*H01P 1/15* (2006.01)
*H03H 7/38* (2006.01)

(52) U.S. Cl. ....................... 333/103; 333/124; 333/132

(58) Field of Classification Search ................ 333/101, 333/103, 124, 132, 134
See application file for complete search history.

(56) References Cited

U.S. PATENT DOCUMENTS

| | | | | |
|---|---|---|---|---|
| 5,442,812 | A | 8/1995 | Ishizaki et al. | |
| 5,903,820 | A * | 5/1999 | Hagstrom | 455/82 |
| 5,926,075 | A * | 7/1999 | Hayashi | 333/101 |
| 6,249,670 | B1 | 6/2001 | Kunkel et al. | |
| 6,496,083 | B1 * | 12/2002 | Kushitani et al. | 333/103 |
| 6,606,015 | B1 * | 8/2003 | Uriu et al. | 333/132 |
| 6,856,187 | B1 * | 2/2005 | Kushitani et al. | 333/132 |

FOREIGN PATENT DOCUMENTS

| | | |
|---|---|---|
| EP | 0 641 090 A2 | 8/1994 |
| EP | 1 087 538 A2 | 3/2001 |
| EP | 1 126 624 A2 | 8/2001 |
| FR | 2 703 536 A1 | 3/1994 |

OTHER PUBLICATIONS

European Search Report.

* cited by examiner

*Primary Examiner*—Dean Takaoka
(74) *Attorney, Agent, or Firm*—Darby & Darby

(57) ABSTRACT

This invention relates to a switching circuit for use at the antenna of a multi-band cellular handset to select between the TX and RX modes of the bands. A number of high isolation switching circuits for selectively connecting a common antenna port to a TX port 2 or an RX port 3 of a multi-band cellular handset are described.

17 Claims, 5 Drawing Sheets

ANTENNA SWITCHING CIRCUIT

This invention relates to a switching circuit for use at the antenna of a multi-band cellular handset to select between the TX and RX modes of the bands.

The recent trend in cellular communications handset technology has been towards an increase in the proliferation of multi-band GSM handsets. For European GSM networks, handsets which operate on the EGSM cellular system and the DCS cellular system have become common; for American GSM networks, handsets which operate on the AGSM and PCS cellular systems have become common; and for world-wide applications, handsets which operate on three or four of the AGSM EGSM, DCS and PCS cellular systems have become popular—see Table 1.

TABLE 1

| System | | TX Frequency Range/MHz | RX Frequency Range/MHz |
|---|---|---|---|
| AGSM | American GSM | 824 – 849 MHz | 869 – 894 MHz |
| EGSM | Extended GSM | 880 – 915 MHz | 925 – 960 MHz |
| DCS | Digital Cellular System | 1710 – 1785 MHz | 1805 – 1880 MHz |
| PCS | Personal Communications System | 1850 – 1910 MHz | 1930 – 1990 MHz |

For the GSM cellular system, TX and RX signals are not processed by the handset simultaneously; therefore, an electronic switching circuit is used to interface the various TX and RX circuits of the handset with a single antenna. This type of switching circuit is typically referred to as an Antenna Switch Module (ASM).

Examples of dual band ASM are disclosed in EP1126624A3 and US20010027119A1. A circuit schematic of a typical dual band ASM is shown in FIG. 1. This module includes an antenna port 1, a pair of TX inputs 2, 2', and a pair of RX outputs 3, 3'. The antenna port is connected to the input of a diplexer DPX, which is a three port device that divides the ASM into two sections: a low-band section LB and a high-band section HB.

The high-band section HB includes an RX output 3 and a TX circuit which comprises a TX input 2 and a TX low pass filter $LPF_1$. In addition, this section includes a single pole double throw (SP2T) switch, which enables selection of the TX high-band or RX high-band modes of operation. The SP2T switch is typically implemented using a pair of PIN diodes: one diode $D_1$ being connected in series with the TX input 2 via the low pass filter $LPF_1$, and the other diode $D_2$ being connected in parallel with the RX output 3. An LC resonator, comprising $L_1$ and $C_1$, is connected in series with diode $D_2$; this resonator is tuned to have a resonance at the centre of the TX high-band frequency range (it should be noted that inductance $L_1$ may simply be the parasitic inductance of the switched on diode $D_2$). The SP2T switch further includes a phase shifting network $P_1$, which is located between the series diode $D_1$, at the TX high-band port 2, and the shunt diode $D_2$, at the RX high-band port 3. Finally, the high-band section of the ASM includes a number of DC biasing components which enable switching the diodes $D_1$ and $D_2$ on and off. The DC biasing components comprise an input $VC_1$ for a DC control voltage, a DC choke $L_C$, a DC blocking capacitor $C_B$, and a smoothing capacitor $C_S$.

The low-band section LB similarly includes an RX output 3' and a TX circuit which comprises a TX input 2' and a TX low pass filter $LPF_2$. This section also includes an SP2T switch, which enables selection of the TX or RX modes of operation for the low-band. The SP2T switch is also implemented using a pair of PIN diodes, one diode $D_3$ being connected in series with the TX low-band input 2' via the low pass filter $LPF_2$, and the other diode $D_4$ being connected in parallel with the RX high-band output 3'. An LC resonator, comprising $L_2$ and $C_2$, is connected in series with diode $D_4$; this resonator is tuned to have a resonance at the centre of the TX low-band frequency range (as above, the inductance $L_2$ may simply be the parasitic inductance of the switched on diode $D_4$). The SP2T switch further includes a phase shifting network $P_2$, which is located between the series diode $D_3$, at the TX low-band port 2', and the shunt diode $D_4$, at the RX low-band port 3'. As above, the low-band section of the ASM includes a number of components which enable switching diodes $D_3$ and $D_4$ on and off; such components comprising an input $VC_2$ for a DC voltage, a DC choke $L_C$, a DC blocking capacitor $C_B$, and a smoothing capacitor $C_S$.

The ASM of FIG. 1 is readily converted to a dual-band front end module (FEM), for operation on the EGSM and DCS cellular bands, by the addition of a DCS bandpass filter at the RX port 3, and by the further addition of an EGSM bandpass filter at the RX low-band port 3'. Such a circuit is disclosed in EP01089449A2. Similarly, the ASM of FIG. 1 is readily converted to a triple band FEM, for operation on the EGSM, DCS and PCS cellular bands, by the addition of a DCS/PCS duplexer at the RX port 3, and by the further addition of an EGSM bandpass filter at the RX low-band port 3'—an example of such a circuit is disclosed in US20020032038A1.

A diode in the on state ideally has zero resistance and zero reactance, and hence will be electrically invisible to RF signals which are fed through it; by contrast, a diode in the off state should have a very high impedance, and hence will appear like an open circuit, and will block RF signals which are fed to it. In practice, a diode in the on state has a non-zero resistance $R_s$ (typically of the order of 1Ω–2Ω), and a non-zero series inductance $L_s$ (typically of the order of 0.5 nH). Similarly, a diode in the off state has a finite resistance $R_p$ (typically of the order of 1,000Ω to 10,000Ω), and also has a small parasitic capacitance $C_p$ (typically ranging from 0.2 pF to 0.4 pF). The two equivalent circuits of a PIN diode, one for the on state and one for the off state, are given in FIG. 2.

The SP2T switches which are used to select between the TX low-band and RX low-band in the low-band section of the ASM, and to select between the TX high-band and the RX high-band in the high-band section of the ASM, are typically implemented using a pair of PIN diodes and a quarter wave phase shifting network. Such a switch is illustrated in FIG. 2 of US04637065. The operation of an SP2T PIN switch can be understood by looking at FIG. 3, which represents the high-band section HB of the circuit of FIG. 1, excluding the low pass filter $LPF_1$. The switch depicted in FIG. 3 is in TX mode when the two diodes $D_1$ and $D_2$ are in the on state; conversely, the switch of FIG. 3 is in RX mode when the two diodes are in the off state—see Table 2.

TABLE 2

| Switch State | Diode D1 | Diode D2 | Control Voltage applied at $VC_1$ |
|---|---|---|---|
| TX Mode | ON | ON | +V |
| RX Mode | OFF | OFF | 0 V |

To switch on diodes $D_1$ and $D_2$, a suitable DC voltage is applied at the control voltage terminal $VC_1$—see Table 2. Capacitor $C_S$ s acts as a smoothing capacitor for this DC supply, components $C_B$ and $L_C$ together act as a bias tee network, and resistor $R_G$ regulates the current flowing through diodes $D_1$ and $D_2$. In TX mode, the switched on diode $D_1$ presents a low resistance path for TX signals entering the switch at the TX port 2, and passing to node X. The switched on diode $D_2$, together with the resonant circuit comprising $L_1$ and $C_1$, similarly provides a low resistance path to ground from node Y. The phase shifting network $P_1$ is designed to have the same electrical characteristics as an ideal transmission line, with an electrical length of one quarter of a wavelength, and with a characteristic impedance of 50 ohms, for RF signals in the centre of the high-band TX frequency range. A quarter wave transmission line has the effect of rotating the complex reflection co-efficient measured at one end of the line through an angle of 180° when measured at the other end of the line. Hence, in TX mode, the short circuit at node Y appears electrically as an open circuit at node X, so that the branch of the circuit containing the diode $D_2$ and the phase shifting network $P_1$ is electrically isolated from node X. Consequently, TX signals entering the switch from the TX port 2 will pass directly to the antenna port 1, and will not pass along the path to the RX port 3.

In RX mode, the TX port 2 is isolated from node X by the switched off diode $D_1$. Similarly, the path from node Y to ground, via diode $D_2$, is isolated from the circuit by the very high impedance of the switched off diode $D_2$. Furthermore, within the RX operating frequency range, phase shifting network $P_1$ is designed to have an impedance of 50 ohms, when it is terminated by an impedance of 50 ohms at the RX port 3. Consequently, the branch of the circuit containing the terminated RX port 3, diode $D_2$, and phase shifting network $P_1$, will appear as a 50 Ω load at node X, so that in this mode RF signals entering the switch at the antenna port 1 will pass through the phase shifting network $P_1$ to the RX output 3.

The SP2T switch in the low-band section LB of the ASM (i.e. the switch including diodes $D_3$ and $D_4$) operates in essentially the same manner as described above for the switch in the high-band section. The primary difference is that the phase shifting network $P_2$ of the low-band switch is designed to have an electrical length of one quarter of a wavelength for RF signals in the centre of the low-band TX frequency range.

For use in an ASM or FEM, the SP2T PIN switch shown in FIG. 3 must fulfil the following requirements: low loss from TX in to Antenna in TX mode, low loss from Antenna to RX in RX mode, high isolation from TX to Antenna in RX mode, and high isolation from TX to RX in TX mode.

In the high-band section of an ASM of a triple-band GSM handset operating on the DCS and PCS bands, the level of isolation from TX to RX, when the ASM is in TX mode, is of particular importance, because the TX high-band extends over the frequency ranges 1710 MHz to 1785 MHz and 1850 MHz to 1910 MHz, and because the RX high-band extends over the frequency ranges 1805 MHz to 1880 MHz and 1930 MHz to 1990 MHz—see Table 1. It can be seen that there is an overlap of the TX and RX bands from 1850 MHz to 1880 MHz; consequently, any signal leaking from TX to RX, when the switch is in TX high-band mode, will not be attenuated by the receive section of the handset in the frequency range from 1850 MHz to 1880 MHz. Coupling the above with the fact that the TX high-band signal levels are typically +30 dBm, and the RX sensitivity of the handset is typically −100 dBm, means that a very high isolation is required of the high-band switch to prevent the high TX signals from entering and saturating the RX circuit of the handset.

The isolation of the SP2T PIN diode switch of FIG. 3 can be estimated using electrical data of commercially available PIN diodes.

When the circuit of FIG. 3 is in TX mode, diodes $D_1$, and $D_2$ are in the on state. In this case, the impedance to ground at node Y of FIG. 3 will be a pure real impedance, and will have a value of $R_s$—see FIG. 2. Over the TX frequency range, the phase shifting network $P_1$ is designed to have the same electrical characteristics as an ideal transmission line, with an electrical length of one quarter of a wavelength, and with a characteristic impedance of 50 ohms. Consequently, the impedance at node X, due to the branch of the circuit containing diode $D_2$, and phase shifting circuit $P_1$, will be given by the expression in equation 1 below.

$$Z_X = \frac{50^2}{R_s} \tag{1}$$

The level of isolation from TX to RX, in TX mode of the circuit of FIG. 3, is determined by two factors:

(1) The ratio of the impedance to ground at node Y, via diode $D_2$, compared with the impedance to ground $Z_{RX}$ at the RX port 3; this is given by the expression for $K_1$ in equation 2a below.

$$K_1 = \frac{Z_{RX}}{R_s} \tag{2a}$$

(2) The ratio of the impedance to ground at node X, due to the branch of the circuit containing diode $D_2$ and phase shifting network $P_1$, compared with the impedance to ground $Z_{ANT}$ at the antenna port; this is given by the expression for $K_2$ in equation 2b below.

$$K_2 = \frac{Z_X}{Z_{ANT}} \tag{2b}$$

Typically, the impedance at the antenna port will be the same as the impedance at the RX port 3, and will have a value of 50Ω. In this case $K_1$ is equal to $K_2$, and is given by the equation 2c below.

$$K = K_l = K_2 = \frac{50}{R_s} \tag{2c}$$

For values of K>>1, the isolation from TX to RX of the SP2T PIN diode switch of FIG. 3 is given approximately by equation 3 below.

$$TX \text{ to } RX \text{ isolation of } PIN \text{ switch of FIG. 3 in } TX \text{ mode} \approx 20\times\mathrm{Log}\left(\frac{1}{K}\right) \tag{3}$$

Typical commercially available PIN diodes have a parasitic resistance $R_s$ of approximately 2Ω in the ON state. For such a diode, the impedance at node X of FIG. 3, when in TX mode, due to the branch of the circuit containing diode $D_2$ and phase shifting network $P_1$, will be 1250 Ω—see equation 1. The load at the antenna port is nominally 50Ω; therefore the ratio K will be 25. In this case, the isolation from TX to RX, in TX mode, will be approximately 28 dB—see equation 3.

In some case a higher isolation is necessary, such as where the switch is required to minimise the PCS TX power leaking to the DCS RX circuit, in TX high-band mode of operation of a triple band GSM cellular handset—see above.

It is an object of the present invention to provide an SP2T switch circuit which can provide a high isolation from TX to RX in TX mode.

Accordingly, the present invention provides a high isolation switching circuit for selectively connecting a common antenna port to a TX port or an RX port of a multi-band cellular handset, the switching circuit including first and second solid state diodes; wherein the first diode has its anode connected to the TX port and its cathode connected to a first node, which is connected both to the antenna port and to one side of a phase shifting and impedance transformation circuit to a second node; wherein the second diode has its anode connected to the second node and its cathode connected to ground via a resonant circuit, and wherein the second node is connected to the RX port via an impedance transformation device, the phase shifting and impedance transformation circuit lowering the impedance of the circuit at the second node when measured at the first node, and the impedance transformation device raising the impedance of the RX port when measured at the second node.

The invention further provides a high isolation switching circuit for selectively connecting a common antenna port to a TX port, or an RX port, of a multi-band cellular handset, the switching circuit including first, second and third solid state diodes; wherein the first diode has its anode connected to the TX port, and its cathode connected to a first node, which is connected both to the antenna port and to one side of a phase shifting network; wherein the other side of the phase shifting network is connected to a second node; and wherein the second and third diodes are connected in parallel to the second node, the second node further being connected to the RX port.

Embodiments of the invention will now be described, by way of example, with reference to the accompanying drawings, in which.

Figure 1:
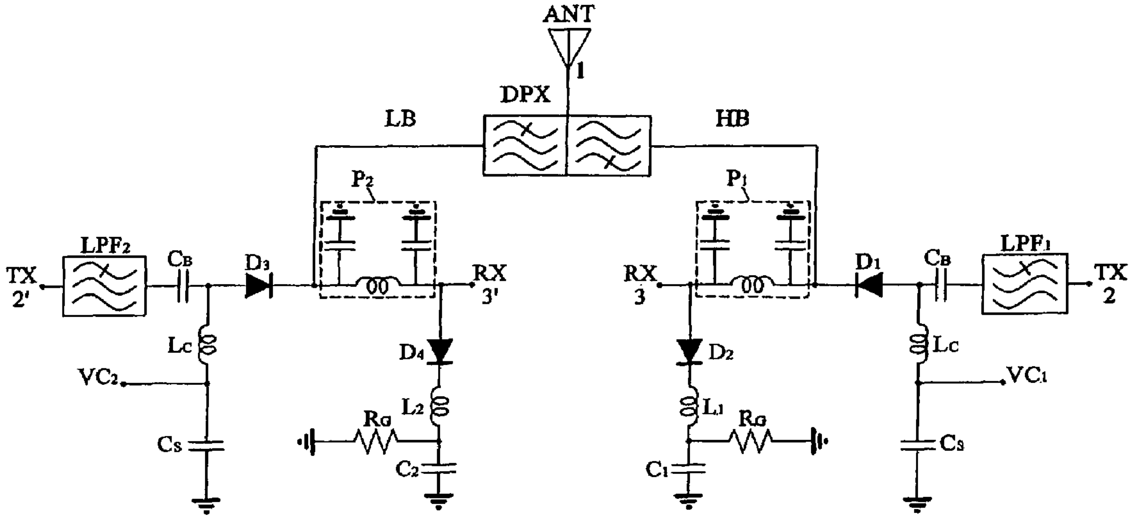
Fig. 1 Prior Art
FIG. 1 is a circuit diagram of a conventional dual-band ASM.
Figure 2:
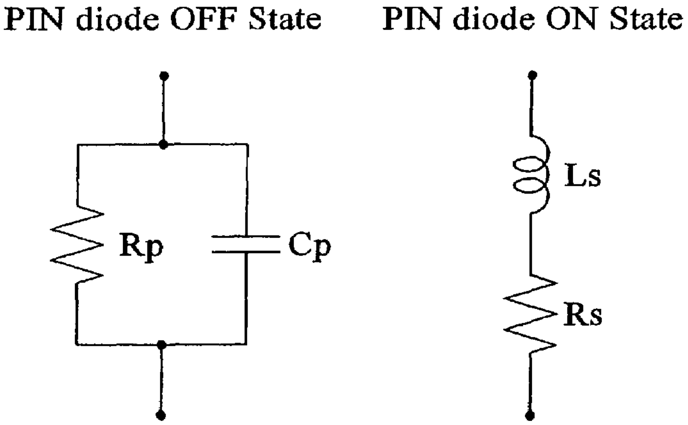
Fig. 2 Prior Art
FIG. 2 shows the equivalent circuit of a PIN diode in OFF and ON states.
Figure 3:
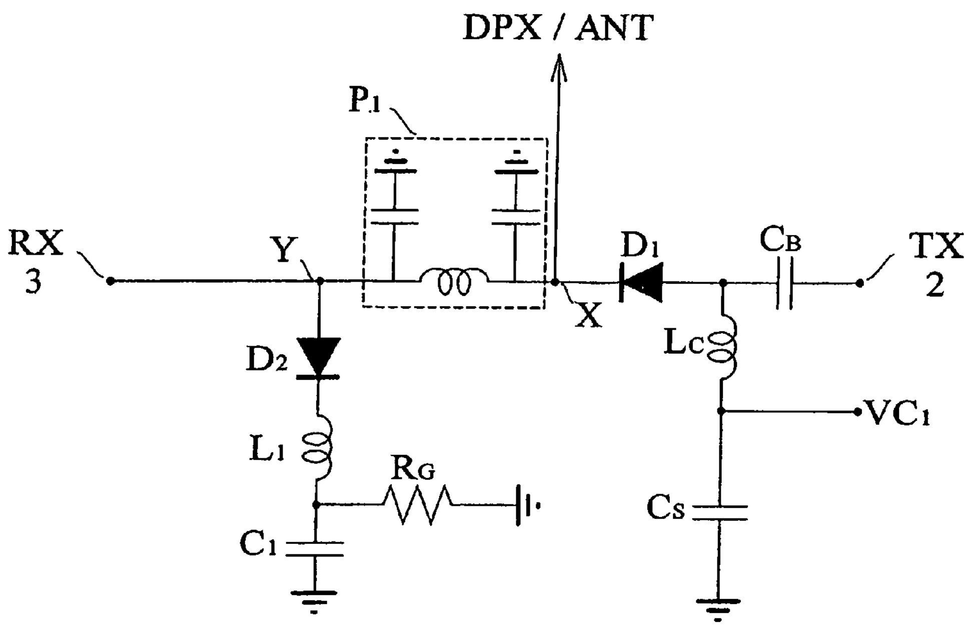
Fig. 3 Prior Art
FIG. 3 shows a conventional SP2T PIN switch.

As stated before, the isolation of the SP2T pin diode switch of FIG. 3 is determined by two factors:

(1) The ratio of the impedance to ground at node Y, via diode $D_2$, compared with the impedance to ground $Z_{RX}$ at the RX port 3—this ratio is given by $K_1$ in equation 2a.

(2) The ratio of the impedance to ground at node X, due to the branch of the circuit containing diode $D_2$ and phase shifting network $P_1$, compared with the impedance to ground $Z_{ANT}$ at the antenna port—this ratio is given by $K_2$ in equation 2b.

Figure 4:
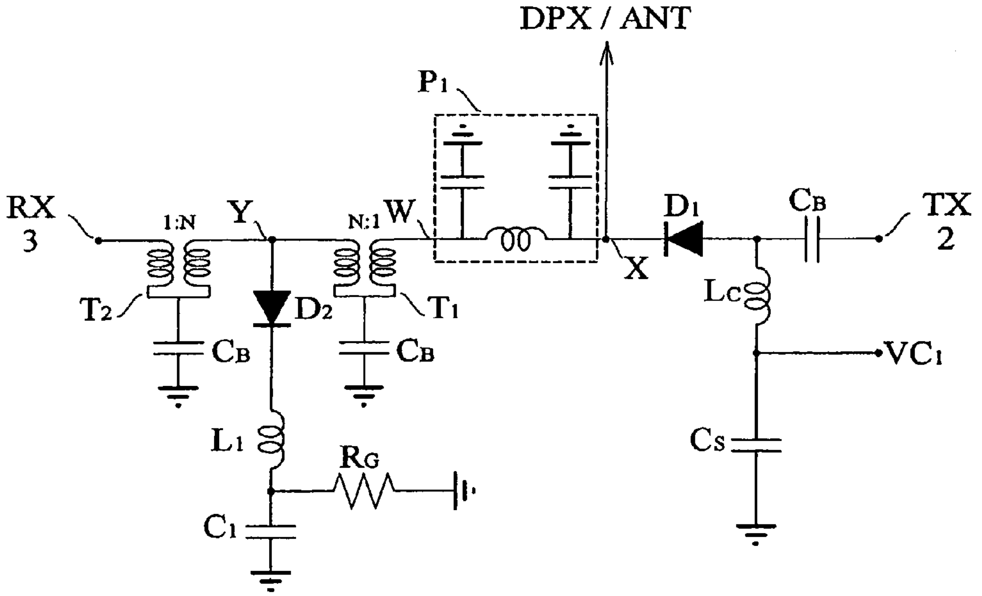
FIG. 4 is a circuit diagram of a first embodiment of the invention.

A circuit according to an embodiment of the invention which increases both ratios $K_1$ and $K_2$ is shown in FIG. 4. To achieve an increase in the ratio $K_1$, a step-up transformer $T_2$, with a turns ratio of 1:N, has been introduced between the RX port 3 and the shunt diode $D_2$. This transformer has the effect of increasing the impedance to ground via the RX port 3, as measured at Y, by a factor of $N^2$, thereby increasing the ratio $K_1$ by a factor of $N^2$.

The circuit of FIG. 4 also includes a step-down transformer $T_1$, with a turns ratio N:1, located between diode $D_2$ and phase shifting network $P_1$. The introduction of transformer $T_1$ has the effect of reducing the impedance of the switched on diode $D_2$, as measured at point W in FIG. 4, by a factor of $N^2$, and similarly increases the impedance of the switched on diode $D_2$, as measured at X (on the far side of phase shifting network $P_1$), by a factor $N^2$—see equation 1. Hence, the introduction of transformer $T_1$, between diode $D_2$ and phase shifting network $P_1$, has the effect of increasing the ratio $K_2$ by a factor of $N^2$.

The addition of a step-up transformer $T_2$ and a step-down transformer $T_1$, on either side of diode $D_2$, ensures that the impedance of the RX port remains at 50 Ω when measured at node X, in RX mode of the switch, but results in an increase in the isolation from TX to RX, in TX mode of the switch. The isolation from TX port 2 to RX port 3 of the circuit of FIG. 4, when in TX mode, is given by equation 4.

$$TX \text{ to } RX \text{ isolation of } PIN \text{ switch of FIG. 4 in } TX \text{ mode} \approx 20\times\mathrm{Log}\left(\frac{1}{N^2K}\right) \quad (4)$$

For example, to increase the isolation of the SP2T PIN diode switch of FIG. 3 by 6 dB approximately, transformer $T_2$ in FIG. 4 should have a turns ratio of $1:\sqrt{2}$ and transformer $T_1$ should have a turns ratio of $\sqrt{2}:1$.

It should be noted that the addition of a step-up transformer $T_2$ and a step-down transformer $T_1$, on either side of diode $D_2$, will also result in a reduction of the parasitic resistance $R_p$ of the switched-off diode, as measured at node X, in the RX mode of the switch. This has the detrimental effect of increasing the loss of the switch when in RX mode.

It should further be noted that DC blocking capacitors $C_B$ are required at the two ground points of transformers T1 and T2 in the circuit of FIG. 4 in order to ensure that the diodes $D_1$ and $D_2$ can be switched on and off by applying a suitable DC voltage to control voltage terminal $VC_1$—see table 2.

The circuit of FIG. 4 can also be configured so that the turns ratio N, of the two transformers, is some value other than $\sqrt{2}$. Increasing N to a value greater than $\sqrt{2}$ will further increase the TX to RX isolation in TX mode. The drawback of increasing N to values higher than $\sqrt{2}$ is that the parallel resistance $R_p$ of the switched-off diode is also reduced, and this has the effect of further increasing the loss of the switch in RX mode.

In practice, transformers which operate at the mobile cellular frequency ranges (1 GHz to 2 GHz) are relatively large, and introduce a relatively high insertion loss in the signal path. As a result, the benefit of the high isolation achievable by the circuit of FIG. 4 would have to be weighed up against the increase in size of the switch and the increase in loss along the RX path of the switch.

For the case where the operating frequency range is small compared with the operating frequency, impedance transformation can be effected using an LC network. Since the bandwidth for TX and RX of most cellular communications systems is relatively narrow compared with the operating frequency (5%–10%—see Table 1), an alternative circuit can be devised which uses a pair of impedance transforming LC networks in place of the transformers $T_1$ and $T_2$ in the SP2T PIN diode switch of FIG. 4. A high isolation SP2T PIN diode switch employing a pair of LC networks for impedance transformation is shown in FIG. 5.

In this case, the LC network $LC_2$ is designed to increase the impedance of the load at the RX port, as measured at node Y, and the LC network $LC_1$ is designed to reduce the impedance back down to its original value.

Figure 5:
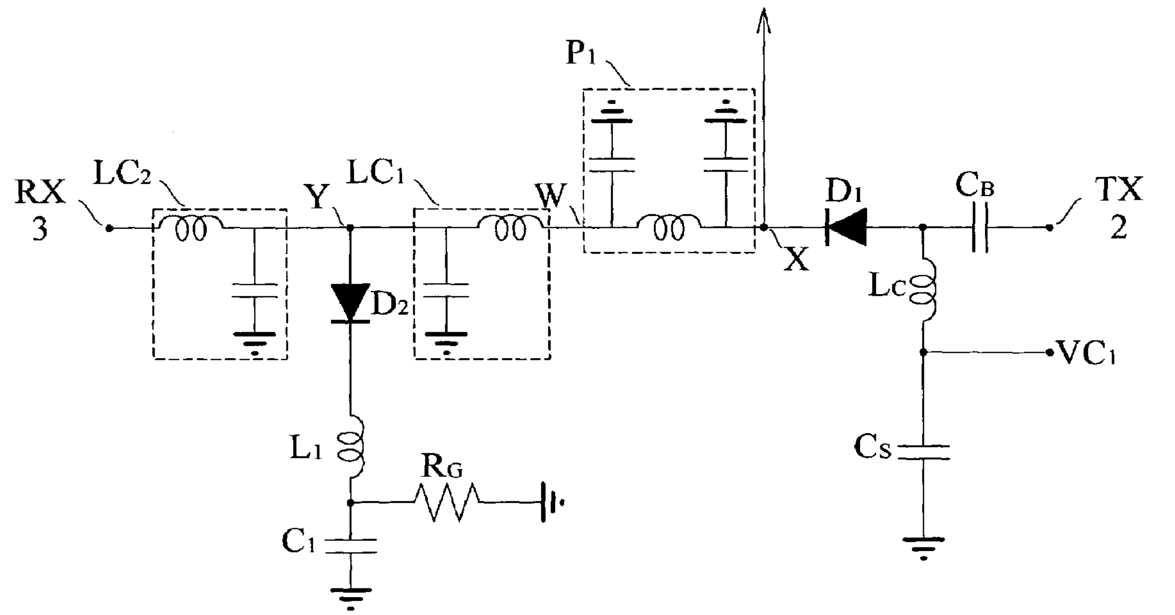
FIG. 5 is a circuit diagram of a second embodiment of the invention.

In this way, when the circuit of FIG. 5 is in RX mode, the impedance to ground at point W, due to the branch of the circuit containing the terminated RX port and LC networks $LC_2$ and $LC_1$, is the same as the impedance measured directly at the RX port 3.

The impedance transformation properties of an LC network are a function of the load; therefore, in the TX mode of FIG. 5 the impedance between node Y and ground, which is dominated by the very small parasitic resistance $R_s$ of the switched on diode D2, is not reduced in the same way that it is when the switch is in RX mode (see above). Consequently, for optimum TX operation, the component values of phase shifting network $P_1$ of FIG. 5 must be reduced so that the combined effects of $LC_1$ and $P_1$ is to rotate the reflection co-efficient at node Y through an angle of 180° when measured at node X.

To achieve approximately the same TX to RX isolation as the SP2T PIN diode switch of FIG. 4, the impedance transformation network $LC_2$ should have the effect of doubling the impedance of the RX port 3, when measured at node Y, and the impedance transformation network $LC_1$, should have the effect of halving the impedance of the RX port, when measured at W.

The circuit of FIG. 5 has the benefit of small size, and the further benefit that the capacitors and inductors of the LC networks can be incorporated into a multi-layer substrate, thereby minimising the additional space required for a high isolation PIN diode switch, compared with the conventional PIN switch of FIG. 3.

Figure 6:
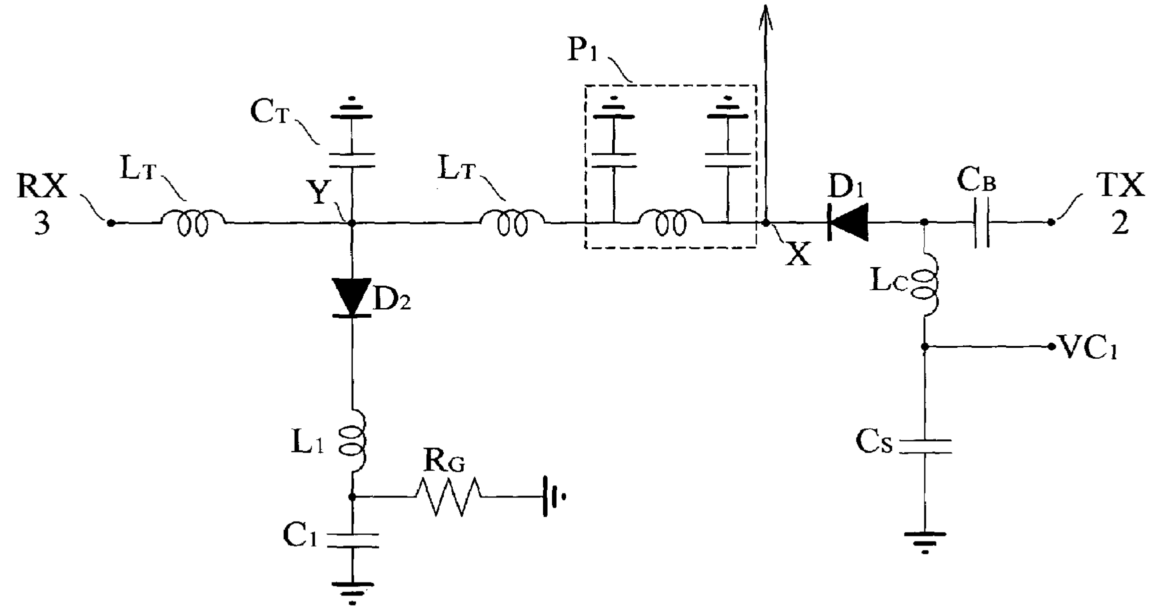
FIG. 6 is a circuit diagram of modification of the second embodiment.

It can be seen that at node Y of the circuit of FIG. 5 there are two capacitors connected in parallel to ground, one which is part of impedance transformation network $LC_1$ and another which is part of impedance transformation network $LC_2$. These two capacitors can be replaced with a single capacitor with double the capacitance of the shunt capacitors in impedance transformation networks $LC_1$ and $LC_2$. FIG. 6 shows a circuit which employs a single capacitor $C_T$ in place of the two shunt capacitors connected at node Y in FIG. 5. This modification has the beneficial effect of further reducing the number of components required to effect high isolation. The components $L_T$ denote the inductors from each of the impedance transformation networks $LC_1$ and $LC_2$ of FIG. 5.

The values of $L_T$ and $C_T$ in FIG. 6, which achieve the required X2 and X0.5 impedance transformations, are frequency dependent, and are given by the following equations:

$$L_T = \frac{Z_O}{\omega_{TX}} \quad 5$$

-continued $$C_T = \frac{1}{Z_O \omega_{TX}} \quad 6$$

where $Z_o$ is the characteristic impedance of the system (usually 50 Ω) and $\omega_{TX}$ is the angular frequency of the centre of the TX high-band.

The circuit of FIG. 4 disclosed an embodiment of the present invention, the object of which was to increase both ratios $K_1$ and $K_2$, as described above. Similarly, it was shown in FIG. 5 that the transformer $T_2$ of FIG. 4 can be replaced by the LC network $LC_2$ in order to raise the impedance of the RX port when measured at node Y, and the transformer $T_1$ in the circuit of FIG. 4 can be replaced by the LC network $LC_1$, which has the effect of reducing the impedance of the RX port back down to 50 Ω when measured at point W.

When the diode $D_2$ of FIG. 4 is in the on state, the impedance to ground at node Y is determined primarily by the parasitic resistance $R_s$ of the switched on diode. Hence, the complex reflection co-efficient measured at node Y of FIG. 4, in TX mode, will have a pure real value, close to −1. Similarly, the complex reflection co-efficient measured at point W of FIG. 4, in TX mode, will have a pure real value, close to −1. Phase shifting network $P_1$ has the effect of rotating the complex the reflection co-efficient at point W of FIG. 4 through an angle of 180°, so that it will have a value close to +1 when measured at node X.

Figure 7:
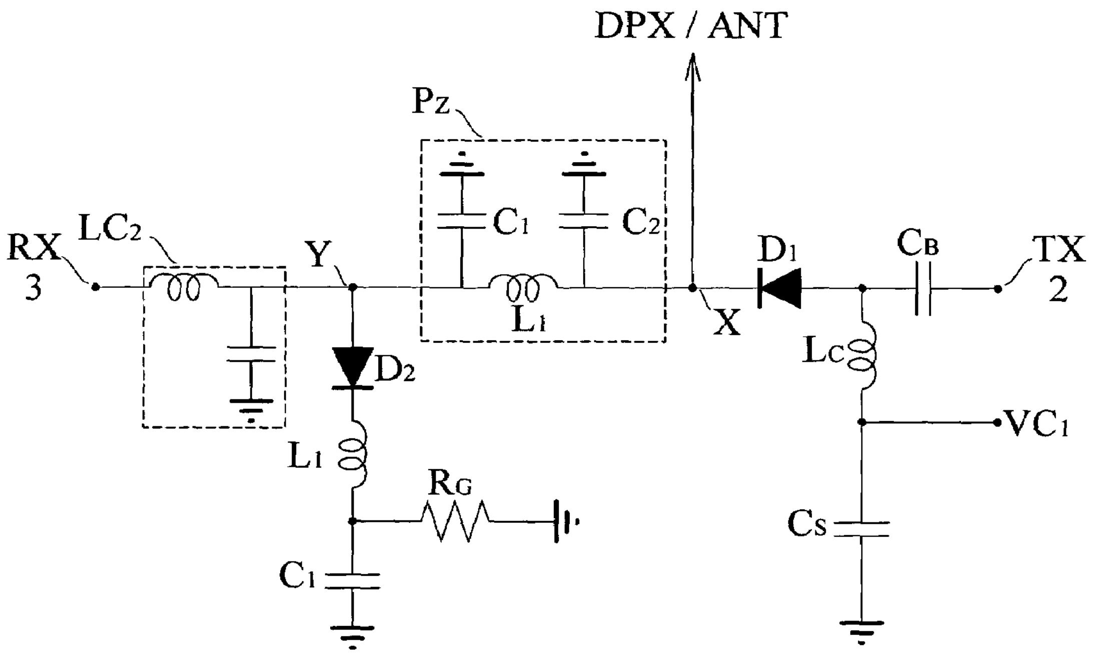
FIG. 7 is a circuit diagram of a third embodiment of the invention.

When the circuit of FIG. 5 is in TX mode, the combination of impedance transformation network $LC_1$ and phase shifting network $P_1$ has the effect of rotating the reflection co-efficient at node Y through 180° when measured at X. However, it is possible to combine the effects of impedance transformation network $LC_1$ and phase shifting network $P_1$ of FIG. 5 with a simpler circuit as shown in FIG. 7, which depicts a fourth embodiment of the present invention. In this case, the phase shifting network $P_1$ has been replaced with another circuit $P_Z$, which comprises components $C_1$, $L_1$ and $C_2$. The three components $C_1$, $L_1$ and $C_2$ are chosen so that phase shifting network $P_Z$ fulfils the dual role of transforming the impedance at node Y, in RX mode of the switch, back down to 50 Ohms, and rotating the complex reflection co-efficient at node Y, in TX mode of the switch, through an angle of 180° when measured at node X.

Figure 8:
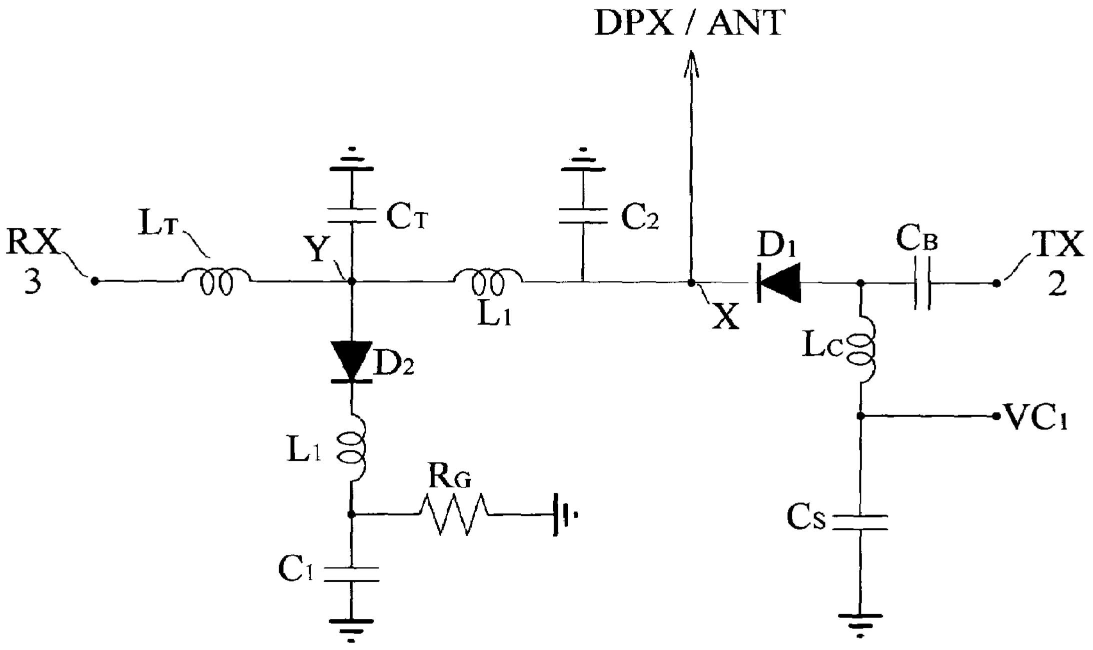
FIG. 8 is a circuit diagram of a modification of the third embodiment of the invention.

It can be seen that there are two capacitors connected from node Y to ground in FIG. 7. As before, these two capacitors can be replaced by a single capacitor with a capacitance which is equal to the sum of the two capacitances connected to node Y. Such a configuration is shown in FIG. 8, in which the two shunt capacitors at node Y of FIG. 7 have been replaced by a single shunt capacitor $C_T$ at node Y in FIG. 8. As before, the component $L_T$ denotes the inductor from the impedance transformation network $LC_2$ of FIG. 7, and components $L_1$ and $C_2$ are unchanged from their values in FIG. 7.

From equation 3, it can be seen that for an SP2T switch, such as that of FIG. 3, designed to be terminated at each port by an impedance of 50Ω, the isolation from TX to RX, in TX mode, is determined primarily by the parasitic resistance $R_s$ of the switched on diode $D_2$. Hence, reducing the parasitic resistance $R_s$ will have the effect of increasing the isolation of the switch from TX to RX, when the switch is in TX mode.

Another approach to achieving higher isolation is to connect a pair of diodes $D_2'$ and $D_2''$ in parallel in place of the single diode $D_2$ in FIG. 3. Such a circuit is shown in FIG. 9.

Connecting diodes $D_2'$ and $D_2''$ in parallel at node Y halves the parasitic impedance to ground due to the switched on diodes. Consequently, the TX to RX isolation of the SP2T PIN diode switch of FIG. 9, when in TX mode, will be improved by approximately 6 dB compared with a SP2T PIN switch which uses only a single diode at node Y, such as that shown in FIG. 3—see equation 3.

Figure 9:
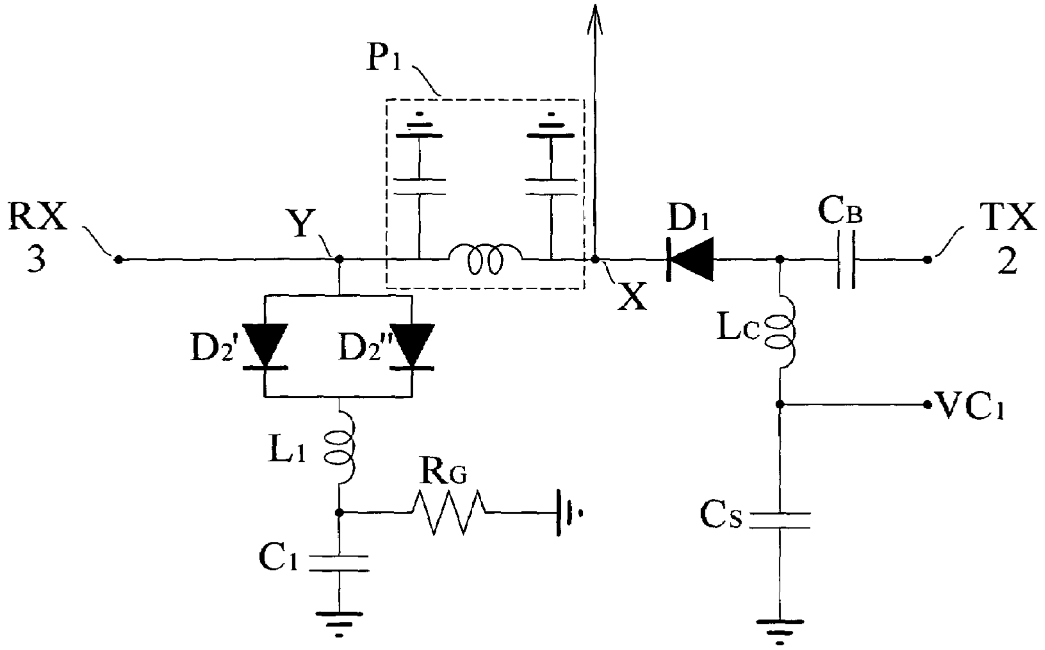
FIG. 9 is a circuit diagram of a fourth embodiment of the invention.

The TX to RX isolation, in TX mode of the switch of FIG. 9, can be further be increased by the connection of several diodes in parallel at node Y. However, connecting multiple diodes at node Y has the drawback of reducing the parasitic resistance at node Y when the diodes are switched off; this has the detrimental effect of increasing the loss of the switch when in RX mode.

Figure 10:
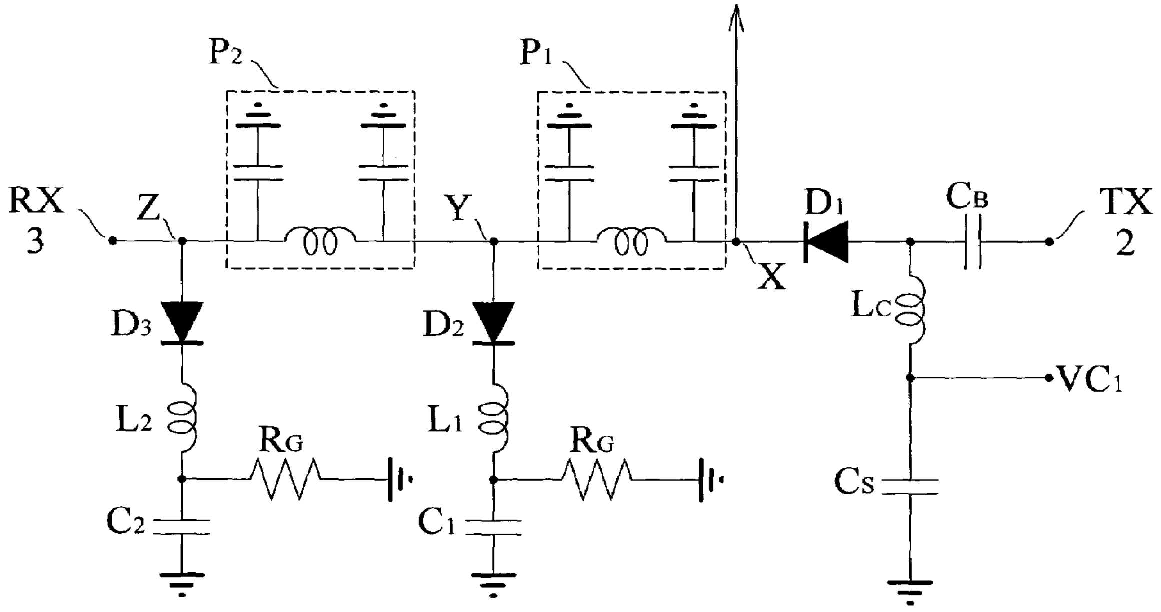
FIG. 10 is a circuit diagram of a fifth embodiment of the invention.

An ASM offering ultra-high isolation from the TX port to the RX port, in TX mode, can be achieved by the circuit configuration shown in FIG. 10, which uses three diodes $D_1$, $D_2$ and $D_3$. In this case, in TX mode (all three diodes switched on), there is a short circuit at node Z due to the low resistance of the switched-on diode $D_3$, and the resonator comprising $L_2$ and $C_2$; this impedance is transformed to a very high value at node Y by the phase shifting network $P_2$. At node Y, the low impedance of the switched on diode $D_2$, and the resonator comprising $L_1$ and $C_1$, gives rise to a second short circuit at node Y. This arrangement maximises the ratio of the impedance to ground looking towards the RX port from node Y, compared with the impedance to ground at node Y via diode $D_2$, and hence maximises the ratio of leaked power arriving at node Y which is fed to ground via diode D2 (and blocked from the RX port). A second phase shifting network $P_1$ transforms the short circuit at node Y to an open circuit at node X (by rotating the complex reflection coefficient through an angle of 180°), so that the RX branch of the circuit does not load the switch at node X.

The circuit of FIG. 10 is capable of providing approximately two times higher isolation from the TX port 2 to the RX port 3, in TX mode of the switch, when compared with the circuit of FIG. 3. For example, using commercially available PIN diodes, an isolation of 56 dB approximately is available using the circuit of FIG. 10, compared with a TX to RX isolation of 28 dB approximately for the SP2T PIN switch of FIG. 3.

The invention is not limited to the embodiments described herein which may be modified or varied without departing from the scope of the invention.

The invention claimed is:

1. A high isolation switching circuit for selectively connecting a common antenna port to a TX port or an RX port of a multi-band cellular handset, the switching circuit including first and second solid state diodes, wherein the first diode has its anode connected to the TX port and its cathode connected to a first node which is connected both to the antenna port and to one side of a phase shifting and impedance transformation circuit to a second node, wherein the second diode has its anode connected to the second node and its cathode connected to ground via a resonant circuit, and wherein the second node is connected to the RX port via an impedance transformation device, the phase shifting and impedance transformation circuit lowering the impedance of the circuit at the second node when measured at the first node and the impedance transformation device raising the impedance of the RX port when measured at the second node.

2. A switching circuit as claimed in claim 1, wherein the phase shifting and impedance transformation circuit comprises a phase shifting circuit and a second impedance transformation device connected between the phase shifting circuit and the second node.

3. A switching circuit as claimed in claim 2, wherein the impedance transformation devices are respective transformers.

4. A switching circuit as claimed in claim 2, wherein the impedance transformation devices are respective LC circuits.

5. A switching circuit as claimed in claim 4, wherein the LC circuits share a common capacitor.

6. A switching circuit as claimed in claim 2, wherein the firstmentioned and second impedance transformation devices approximately double and halve the relevant impedances respectively.

7. A switching circuit as claimed in claim 1, wherein the phase shifting and impedance transformation circuit combines the functions of phase shifting and impedance transformation.

8. A switching circuit as claimed in claim 7, wherein the impedance transformation device is an LC circuit.

9. A switching circuit as claimed in claim 8, wherein the LC circuit shares a common capacitor with the phase shifting and impedance transformation circuit.

10. A switching circuit as claimed in claim 7, wherein the phase shifting and impedance transformation circuit and the second impedance transformation device approximately halve and double the relevant impedances respectively.

11. A switching circuit as claimed in claim 1, wherein the solid state diodes are PIN diodes.

12. A switching circuit as claimed in claim 8, wherein the phase shifting and impedance transformation circuit and the second impedance transformation device approximately halve and double the relevant impedances respectively.

13. A switching circuit as claimed in claim 9, wherein the phase shifting and impedance transformation circuit and the second impedance transformation device approximately halve and double the relevant impedances respectively.

14. A high isolation switching circuit for selectively connecting a common antenna port to a TX port or an RX port of a multi-band cellular handset, the switching circuit comprising:

first, second and third solid state diodes;

wherein the first diode has its anode connected to the TX port and its cathode connected to a first node which is connected both to the antenna port and to one side of a first phase shifting network, wherein the other side of the first phase shifting network is connected to a second node;

wherein the second diode has its anode connected to the second node and its cathode connected to ground via a first resonant circuit, wherein the third diode has its anode connected to a first side of a second phase shifting network and its cathode connected to ground via a second resonant circuit, a second side of the second phase shifting network is connected to the second node, the second node further being connected to the RX port.

15. A switching circuit as claimed in claim 14, wherein the solid state diodes are PIN diodes.

16. A high isolation switching circuit for selectively connecting a common antenna port to a TX port or an RX port of a multi-band cellular handset, the switching circuit comprising:

first, second and third solid state diodes;

wherein the first diode has its anode connected to the TX port and its cathode connected to a first node which is connected both to the antenna port and to one side of a phase shifting network, wherein the other side of the phase shifting network is connected to a second node; and wherein the second and third diodes have their anodes connected in common to the second node and their cathodes connected in common to one side of a resonant circuit, the other side of which is connected to ground, the second node further being connected to the RX port.

17. A switching circuit as claimed in claim 16, wherein the solid state diodes are PIN diodes.

* * * * *